United States Patent
Bharti et al.

(10) Patent No.: US 8,624,468 B2
(45) Date of Patent: Jan. 7, 2014

(54) ELECTROMECHANICAL MATERIALS AND DEVICES INCLUDING THE SAME

(75) Inventors: Vivek Bharti, Cottage Grove, MN (US); Thu-Van T. Tran, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 12 days.

(21) Appl. No.: 13/141,874

(22) PCT Filed: Nov. 10, 2009

(86) PCT No.: PCT/US2009/063781
§ 371 (c)(1),
(2), (4) Date: Jun. 23, 2011

(87) PCT Pub. No.: WO2010/077438
PCT Pub. Date: Jul. 8, 2010

(65) Prior Publication Data
US 2011/0260578 A1    Oct. 27, 2011

Related U.S. Application Data

(60) Provisional application No. 61/141,497, filed on Dec. 30, 2008.

(51) Int. Cl.
*H01L 41/08* (2006.01)

(52) U.S. Cl.
USPC .......................................... 310/328; 310/800

(58) Field of Classification Search
USPC ......... 310/328, 800, 358, 314, 365–366, 311; 428/421
IPC ....................................................... H01L 41/08
See application file for complete search history.

(56) References Cited

U.S. PATENT DOCUMENTS

| 3,365,315 A | 1/1968 | Beck |
| 4,391,646 A | 7/1983 | Howell |
| 4,618,525 A | 10/1986 | Chamberlain |
| 4,830,795 A | 5/1989 | Scheinbeim |
| 4,863,648 A | 9/1989 | Scheinbeim |

(Continued)

FOREIGN PATENT DOCUMENTS

| EP | 1526757 | 4/2005 |
| JP | 3026043 | 6/1984 |
| WO | WO 95/16999 | 6/1995 |
| WO | WO 03/095578 | 11/2003 |

OTHER PUBLICATIONS

Danz, "Sensor and Optical Properties of Ferroelectric and Porous Fluoropolymers", IEEE Transactions on Dielectrics and Electrical Insulation, Apr. 2004, vol. 11, No. 2, pp. 286-292.

(Continued)

*Primary Examiner* — Thomas Dougherty
*Assistant Examiner* — Karen B Addison
(74) *Attorney, Agent, or Firm* — Stephen L. Crooks

(57) ABSTRACT

An electromechanical article that includes a composite material (110) including a polymer and at least one expanded microsphere having an outer shell of a shell material and a gas contained within the outer shell, wherein the polymer at least partially encapsulates the microsphere and wherein the polymer, shell material and gas all have different dielectric constants. Devices including such articles and methods of making the articles are also disclosed.

15 Claims, 1 Drawing Sheet

(56) References Cited

U.S. PATENT DOCUMENTS

| | | | |
|---|---|---|---|
| 5,229,979 | A | 7/1993 | Scheinbeim |
| 6,423,412 | B1 * | 7/2002 | Zhang et al. ............... 428/421 |
| 6,509,384 | B2 | 1/2003 | Kron |
| 6,605,246 | B2 * | 8/2003 | Zhang et al. ............... 264/461 |
| 2001/0024712 | A1 | 9/2001 | Kirjavainen |
| 2006/0189269 | A1 | 8/2006 | Roy |

OTHER PUBLICATIONS

Gerhard-Multhaupt, "Less can be More: Holes in Polymers lead to a New Paradigm of Piezoelectric Materials for Electret Transducers", IEEE Transactions on Dielectrics and Electrical Insulation, Oct. 2002, vol. 9, No. 5, pp. 850-895.

Hillenbrand, "Quasistatic and Dynamic Piezoelectric Coefficients of Polymer Foams and Polymer Film Systems", IEEE Transactions on Dielectrics and Electrical Insulation, Feb. 2004, vol. 11, No. 1, pp. 72-79.

Madden, "Artificial Muscle Technology: Physical Principles and Naval Prospects", IEEE Journal of Oceanic Engineering, Jul. 2004, vol. 29, No. 3, pp. 706-728.

Mae, "Effects of strain rate and density on tensile behavior of polypropylene syntactic foam with polymer microballoons", Materials Science and Engineering A, 2008, vol. 477, pp. 168-178.

Saarimaki, "Novel Heat Durable Electromechanical Film: Processing for Electromechanical and Electret Applications", IEEE Transactions on Dielectrics and Electrical Insulation, Oct. 2006, vol. 13, No. 5, pp. 963-972.

Samel, "Expandable Microspheres Incorporated in a PDMS Matrix: A Novel Thermal Composite Actuator for Liquid Handling in Microfluidic Applications", Transducers 2003, The 12$^{th}$ International Conference on Solid State Sensors, Actuators and Microsystems, Boston, Jun. 8-12, 2003, pp. 1558-1561.

Windmill, "Nanomechanical and electrical characterization of a new cellular electrets sensor-actuator", Nanotechnology, 2008, vol. 19, No. 035506, 7 pages.

Zeqiri, "A Novel Pyroelectric Method of Determining Ultrasonic Transducer Output Power: Device Concept, Modeling, and Preliminary Studies", IEEE Transactions on Ultrasonics, Ferroelectrics, and Frequency Control, Nov. 2007, vol. 54, No. 11, pp. 2318-2330.

Zhang, "Improvement of piezoelectric activity of cellular polymers using a double-expansion process", Journal of Physics D: Applied Physics, 2004, vol. 37, pp. 2146-2150.

Zhenyl, "High Field Electrostrictive Response of Polymers", Journal of Polymer Science: Part B: Polymer Physics, 1994, vol. 32, pp. 2721-2731.

International Search Report for PCT/US2009/063781, 5 pages.

* cited by examiner

ELECTROMECHANICAL MATERIALS AND DEVICES INCLUDING THE SAME

CROSS REFERENCE TO RELATED APPLICATIONS

This application is a national stage filing under 35 U.S.C. 371 of PCT/US2009/063781, filed Nov. 10, 2009, which claims priority to Provisional Application No. 61/141,497, filed Dec. 30, 2008, the disclosure of which is incorporated by reference in its/their entirety herein.

FIELD

The present disclosure relates to electromechanical materials and devices that include such materials.

BACKGROUND

Production of an electric voltage in response to mechanical excitation (piezoelectricity) or thermal excitation (pyroelectricity) generally requires a material to have a preferred dipole orientation in its structure. A preferred dipole orientation occurs naturally in some crystals, e.g. quartz, and can be induced in some ceramic and polymeric materials by application of strong electrical or mechanical fields.

BRIEF SUMMARY

Disclosed herein is an electromechanical article that includes a composite material comprising (1) a polymer and (2) at least one microsphere having an outer shell of a shell material and a gas or liquid contained within the outer shell, wherein the polymer at least partially encapsulates the microsphere and wherein the polymer, shell material and gas or liquid all have different dielectric constants. The electromechanical article has piezoelectric properties or pyroelectric properties.

Also disclosed herein is an electromechanical device that includes an electromechanical layer, the electromechanical layer including a composite material comprising (1) a polymer and (2) at least one microsphere having an outer shell of a shell material and a gas or liquid contained within the outer shell, wherein the polymer at least partially encapsulates the microsphere and wherein the polymer, the shell material or the microsphere and the gas or liquid within the outer shell of the microsphere all have different dielectric constants; a first conductive layer; and a second conductive layer, wherein the electromechanical layer is positioned between and in electrical connection with both the first conductive layer and the second conductive layer.

Also disclosed herein is a method of making an electromechanical article, the method including the steps of forming a composite composition by combining a polymer and a plurality of microspheres, wherein each of the plurality of microspheres has an outer shell of a shell material and a gas or liquid contained within the outer shell; forming a film of the composite composition; and heating the film of the composite composition to expand the gas or liquid contained within the outer shell of the microspheres so that the microsphere expands.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

Figure 1:
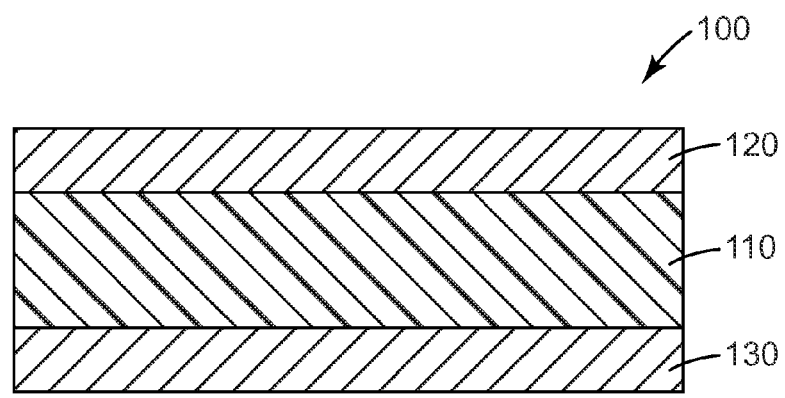
FIG. 1 depicts an exemplary electromechanical article as disclosed herein.

In the following description, reference is made to the accompanying drawings that form a part hereof, and in which are shown by way of illustration several specific embodiments. It is to be understood that other embodiments are contemplated and may be made without departing from the scope or spirit of the present invention. The following detailed description, therefore, is not to be taken in a limiting sense.

DETAILED DESCRIPTION

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Disclosed herein are electromechanical materials, layers, articles and devices. An electromechanical material is a material that exhibits piezoelectricity (or piezoelectric properties) or pyroelectricity (or pyroelectric properties). The generation of a surface charge in response to the application of an external stress to a material is called piezoelectricity. A change in the spontaneous polarization of a material in response to a change in temperature is called pyroelectricity. Some electromechanical materials as described herein have piezoelectric properties and some have pyroelectric properties. There is a need for new piezoelectric and pyroelectric materials. Although non-polar polymeric materials have been rendered piezoelectric, they have not yet been made controllably porous and may not offer sufficient strength for some applications.

An exemplary method includes the steps of preparing a composite composition, forming a film of the composite composition, and heating the film of the composite composition forming a composite material. A composite composition as disclosed herein includes at least one polymer and a plurality of microspheres. A composite composition can also be referred to as a coating composition when the film will be formed using solution casting methods. The composite material formed from the composite composition includes (1) the polymer and (2) at least one microsphere, wherein the microsphere has an outer shell of a shell material and wherein the microsphere contains a gas or liquid within the outer shell of the microsphere (i.e., within the interior of the microsphere). The polymer, the outer shell of the microsphere, and the gas or liquid within the outer shell of the microsphere all have different dielectric constants.

One or more than one kind of polymer can be included in the composite compositions and the resulting composite materials. The polymers can be polar or non-polar. These polymers can have, but need not have, piezoelectric properties. Exemplary polymers, copolymers and their blends that can be utilized include, but are not limited to, polyolefin such as polypropylene, polyethylene and copolymers thereof; vinyl polymers such as poly(vinylidene fluoride), poly(vinyl fluoride), poly(vinyl chloride) and copolymers thereof; polyureas, polythiourea and copolymers thereof; cyano-containing polymers such as poly(acrylonitrile), poly(acrylonitrile/vinyl acetate), poly(acrylonitrile/methylacrylate) and poly(acrylonitrile/allylcyanide); poly(methyl methacrylate); polyesters (including but not limited to poly(ethylene terephthalate)); and polyamides (including but not limited to nylons).

In some embodiments, poly(vinylidene fluoride) polymers or poly(vinylidene fluoride) copolymers can be utilized. An exemplary poly(vinylidene fluoride) copolymer that can be utilized is poly(vinylidene fluoride/trifluoroethylene) copolymer (referred to herein as "P(VDF-TrFE)"). In other embodiments, polypropylene can be utilized as the polymer.

A composite composition as disclosed herein also includes a plurality of microspheres in addition to the polymer described above. In an embodiment, one or more than one kind of microspheres may be utilized. A microsphere generally is an article that includes an outer shell and a gas or liquid contained within the outer shell. The outer shell is made of a shell material. In an embodiment, microspheres that can be utilized often have an unexpanded average diameter ranging from about 0.005 μm (micrometers) to about 500 μm or larger. For example, the unexpanded average diameter can be at least 0.005 μm, at least 0.01 μm, at least 0.05 μm, at least 0.1 μm, at least 0.2 μm, at least 0.5 μm, at least 1 μm, at least 2 μm, or at least 5 μm. The unexpanded average diameter can be up to 500 μm, up to 200 μm, up to 100 μm, up to 50 μm, up to 20 μm, or up to 10 μm. The unexpanded average diameter can be in the range of 0.1 to 100 μm, in the range of 1 to 100 μm, or in the range of 5 to 100 μm or larger. In an embodiment, microspheres that can be utilized can have an unexpanded diameter. Exemplary types of microspheres include, but are not limited to polymeric microspheres, glass microspheres, and ceramic microspheres.

Polymeric microspheres generally include a thermally expandable polymer shell that entraps a gas or liquid propellant. The expansion is typically irreversible and the expanded microspheres have a larger average diameter than the unexpanded microspheres. The polymer shell can be made of a homopolymer or copolymer of ethylenically unsaturated monomers that include more than 85 wt %, more than 90 wt %, or more than 95 wt % of nitrile-containing monomers. The nitrile-containing monomers can be selected from one or more of acrylonitrile, methacrylonitrile, α-chloroacrylonitrile, α-ethoxyacrylonitrile, fumaronitrile, or crotonitrile. In an embodiment, the nitrile-containing monomers can be selected from one or more of acrylonitrile, methacrylonitrile or a mixture thereof. If other ethylenically unsaturated monomers are present, they are generally present in an amount up to about 5 wt %, up to about 10 wt %, or up to about 15 wt % based on a total weight of the monomers. For example, the amount of the other ethylenically unsaturated monomers can be from 0.1 to 5 wt %, from 0.1 to 3 wt %, from 0.1 to 2 wt % or from 0.1 to 1 wt %, Such optional ethylenically unsaturated monomers can be selected from one or more methacrylate esters such as methyl methacrylate, ethyl methacrylate and isobornyl methacrylate; acrylate esters such as methylacrylate, ethylacrylate and n-butylacrylate; vinyl halides such as vinyl chloride, vinylidene chloride and vinylidene fluoride; vinyl amides such as vinyl pyridine; vinyl esters such as vinyl acetate; styrenes such as styrene, halogenated styrenes and α-methyl styrene; and alkenes such as butadiene, isoprene and chloroprene. The shell material can also include crosslinking multifunctional monomers including, but not limited to, one or more of divinyl benzene, ethylene glycol di(meth)acrylate, diethylene glycol di(meth)acrylate, triethylene glycol di(meth)acrylate, propylene glycol di(meth)acrylate, 1,4-butanediol di(meth)acrylate, 1,6-hexanediol di(meth)acrylate, glycerol di(meth)acrylate, 1,3-butanediol di(meth)acrylate, neopentyl glycol di(meth)acrylate, 1,10-decanediol di(meth)acrylate, pentaerythritol tri(meth)acrylate, pentaerythritol tetra(meth)acrylate, pentaerythritol hexa(meth)acrylate, dimethylol tricyclodecane di(meth)acrylate, triallylformal tri(meth)acrylate, allyl methacrylate, trimethylol propane tri(meth)acrylate, trimethylol propane triacrylate, tributanediol di(meth)acrylate, polyethylene glycol di(meth)acrylate (such as those having a polyethylene glycol unit with a weight average molecular weight in the range of about 100 to 1000 grams/mole), 3-acryloyloxyglycol monoacrylate, triacryl formal or triallyl isocyanate.

Polymeric microspheres are commercially available under the trade designation EXPANCEL from Expancel in Duluth, Ga. Information regarding EXPANCEL microspheres can be found in U.S. Pat. No. 6,509,384, the disclosure of which is incorporated herein by reference. Polymeric microspheres under the trade designation EXPANCEL are available in various forms such as unexpanded and in a solvent (EXPANCEL WU), unexpanded and dry (i.e., no solvent present) (EXPANCEL DU), unexpanded and in an aqueous dispersion (EXPANCEL SL), unexpanded microspheres in a matrix (EXPANCEL MB), expanded and in a solvent (EXPANCEL WE), or expanded and dry (EXPANCEL DE).

In some embodiment, EXPANCEL DU microspheres are utilized such as EXPANCEL 551 DU 20; EXPANCEL 551 DU40; EXPANCEL 461 DU 20; EXPANCEL 461 DU 40; EXPANCEL 051 DU 40; EXPANCEL 053 DU 40; EXPANCEL 009 DU 80; EXPANCEL 091 DU 80; EXPANCEL 091 DU 140; EXPANCEL 092 DU 80; EXPANCEL 092 DU 120; EXPANCEL 093 DU 120; EXPANCEL 920 DU 40; EXPANCEL 930 DU 120; EXPANCEL 950 DU 80; and EXPANCEL 950 DU 120. These microspheres are available in various unexpanded average particle size in the range of 6 to 9 μm, in the range of 10 to 14 μm, in the range of 10 to 16 μm, in the range of 9 to 15 μm, in the range of 18 to 24 μm, in the range of 35 to 45 μm, and in the range of 28 to 38 μm. Some of the unexpanded particle size ranges are also available in more than one type of material.

The polymeric microspheres can encapsulate a gas or liquid that acts as a propellant. Generally, the propellant is a liquid at room temperature and has a boiling point at atmospheric pressure below the softening point of the shell material. The propellant expands when heated causing expansion of the outer shell of the polymeric microspheres. For example, the polymeric microspheres can include a liquid or gas selected from isooctane, (2,2,4-trimethyl pentane), butanes, pentanes, hexanes, heptanes, petroleum distillates, or other liquids with a suitable boiling point or boiling point range or combinations thereof. In an embodiment, hydrocarbons such as isobutane, isopentane, n-pentane, n-hexane, petroleum ether or n-heptane can be utilized alone or in combination with isooctane.

In other embodiments, glass microspheres can also be utilized. Glass microspheres can be fabricated as discussed in U.S. Pat. Nos. 3,365,315; 4,391,646; and 4,618,525, the disclosures of which are incorporated herein by reference. Such exemplary glass microspheres have a shell material that includes a glass. In an embodiment, the shell material may include $SiO_2$, $Na_2O$, $CaO$, $K_2O$, $Li_2O$, $BaO$, $MgO$, $SrO$, $ZnO$, $PbO$, $TiO_2$, $MnO_2$, $ZrO_2$, $B_2O_3$, $Al_2O_3$, $Fe_2O_3$, $Sb_2O_3$, $P_2O_5$, $V_2O_5$, or combinations thereof for example. In an embodiment, the shell material includes a majority (by weight) of $SiO_2$ and optionally other components.

Glass microspheres can contain various different gases within the glass shell material. Exemplary gases include, but are not limited to, $H_2O$, $CO_2$, $SO_2$, $SO_3$, $F_2$, $N_2$, $O_2$, or mixtures thereof. In an embodiment, $SO_2$, $SO_3$, $O_2$, $CO_2$, $N_2$, or mixtures thereof can be contained in the interior (i.e., within the outer shell) of the glass microspheres.

In an embodiment, microspheres composed of ceramic materials can also be utilized. Exemplary ceramic materials include, but are not limited to, oxides such as alumina, zirconia, barium titanate, lead zirconate titanate (PZT); non-oxides such as carbides, borides, nitrides and silicides; and composites such as particulate reinforced materials and combinations of oxides and non-oxides. Such ceramic materials can encapsulate gases, including inorganic gases (such as $H_2O$, $CO_2$, $SO_2$, $SO_3$, $F_2$, $N_2$, $O_2$, or mixtures thereof) or organic gases (such as isooctane, (2,2,4-trimethyl pentane), butanes, pentanes, hexanes, heptanes, petroleum distillates, other liquids with a suitable boiling point or boiling point range or combinations thereof), or combinations thereof.

Composite compositions are provided that include a mixture of the microspheres and the polymer. These compositions can also include one or more solvents. Composite compositions can be formed into articles by various processes, including, but not limited to extrusion, hot pressing and solution casting for example. Composite compositions that are to be formed into articles using extrusion or hot pressing for example would not necessarily include one or more solvents. Conversely, a composite composition that is to be formed into an article using solution casting (more specifically, a coating composition) would more likely than not include one or more solvent.

The one or more solvents can be utilized to form a substantially homogenous mixture of the polymer and the microspheres. In an embodiment, the one or more solvent that can be used is one that 1) can dissolve or at least partially dissolve the polymer that is utilized and 2) can allow the formation of a composite composition that is amenable to be coated. In an embodiment, the solvent (or solvents) that is chosen can be based at least in part on the particular polymer being utilized, the microsphere being utilized, the material upon which the composite composition will be coated, or a combination thereof.

In an embodiment that utilizes a non-polar polymer, generally, a non-polar solvent can be utilized. In an embodiment that utilizes a polar polymer, generally, a polar solvent can be utilized. In an embodiment that utilizes P(VDF-TrFE), methylethyl ketone (MEK) can be utilized as the solvent.

The composite composition can also optionally include other components. Exemplary optional components include additives to effect the processing of the composite composition. Exemplary processing additives include, but are not limited to, plasticizers, antioxidants, clay and UV stabilizers for example. Plasticizers can also function to advantageously effect the ability of the microspheres (especially polymeric microspheres such as those available under the trade designation EXPANCEL) to expand within the polymer. Appropriate amounts of such processing additives (plasticizers for example) would be known to one of skill in the art. Exemplary optional components can also include additives to affect the electromechanical properties of the coating composition (or a film formed there from). Examples of such additives include piezoelectric additives, which can include, but are not limited to, known piezoelectric materials such as barium titanate ($BaTiO_3$) and lead zirconate titanate (PZT) for example. Examples of such additives also include pyroelectric additives, which can include, but are not limited to, lead titanate ($PbTiO_3$), lithium tantalite ($LiTaO_3$), gallium nitride (GaN), sodium nitride ($NaNO_2$), and polyvinylidene fluoride (PVDF) for example. Appropriate amounts of such piezoelectric or pyroelectric additives would be known to one of skill in the art.

In an embodiment where the composite composition is to be solution cast into a film, the amount of polymer in a composite composition can be dictated, at least in part, on the desire to have a composite composition that can be easily and reproducibly coated onto a substrate, the solubility of the polymer being utilized, the amount of microspheres utilized, or a combination thereof. The amount of polymer and solvent can be dictated at least in part on the method of forming the film.

The amount of microspheres included in the composite composition can vary somewhat. The greater the amount of microspheres, the larger the number of interfaces (between the polymer and the shell material) present in a final article; as the number of interfaces increases, the overall polarity of the article should theoretically increase, which can lead to larger piezoelectric or pyroelectric properties. In an embodiment, the composite composition can contain microspheres, such as polymeric microspheres, in an amount from about 0.1 wt % to about 70 wt % based on the weight of the total composite composition. In some examples, the composite composition contains at least 0.1 wt %, at least 0.2 wt %, at least 0.5 wt %, at least 1 wt %, at least 2 wt %, at least 5 wt % or at least 10 wt % microspheres based on the weight of the total composite composition. The composite composition can contain up to 70 wt %, up to 60 wt %, up to 50 wt %, up to 40 wt %, up to 20 wt %, up to 15 wt %, or up to 10 wt % based on the weight of the total composite composition. In an embodiment, the composite composition can contain from about 1 wt % to about 20 wt % microspheres, such as polymeric microspheres, based on the weight of the total composite composition. In an embodiment, the composite composition can contain from about 1 wt % to about wt 10% microspheres, such as polymeric microspheres, based on the weight of the total composite composition. In an embodiment, the composite composition can include from about 3 wt % to about 15 wt % microspheres based on the total weight of the composite composition. In an embodiment, the composite composition can include from about 5 wt % to about 10 wt % microspheres based on the total weight of the composite composition.

Once the composite composition is prepared, a film of the composite composition is then formed. Numerous methods can be utilized to form a film of the composite composition, including, but not limited to extrusion, hot pressing and solution casting for example. In an embodiment where extrusion is utilized to form a film, the components of the composite composition can be added to an extruder and an appropriate die can be utilized to form a film of the composite composition. In an embodiment where solution casting is utilized to form a film of the composite composition, the composite composition (generally including a solvent) can be applied to a substrate via one of a number of methods. A film that has been cast from solution can also be hot pressed between two plates after being cast. Exemplary methods of forming a coating include, but are not limited to, knife coating, immersion (dip) coating, gap coating, curtain coating, rotary screen coating, reverse roll coating, Gravure coating, metering rod (Meyer bar) coating and slot die (extrusion) coating for example. In an embodiment, the particular coating method chosen can depend at least in part on the amount of microspheres in the composite composition, the desired thickness of the coating, other factors not discussed herein, or a combination thereof.

In an embodiment where the composite composition is solution cast, a dry coating thickness of the composite composition can range from about 0.1 micrometers (μm) to about 500 μm. The thickness can be at least 0.1 μm, at least 0.2 μm, at least 0.5 μm, at least 1 μm, at least 2 μm, at least 5 μm, at least 10 μm, or at least 20 μm. The thickness can be up to 500 μm or greater, up to 400 μm, up to 300 μm, up to 200 μm, up to 100 μm, or up to 50 μm. In an embodiment, the solution cast coating composition can have a wet coating thickness from about 0.1 μm to about 100 μm. In an embodiment, the solution cast composite composition can have a dry coating thickness from about 10 μm to about 50 μm. Once the composite composition has been solution cast, the solvent from the composite composition can be at least partially evaporated. This can be accomplished by drying the film in an oven or at room temperature. The temperature necessary to at least partially evaporate at least part of the solvent can depend at least in part on the amount of solvent in the composite composition, the particular solvent (or solvents), the particular polymer, or a combination thereof. In an embodiment where the polymer is P(VDF-TrFE) and the solvent is MEK, the solvent can be at least partially evaporated in an oven set at about 60° C.

Once a film of the composite composition is prepared, the film is often heated to expand the gas or liquid located inside the microspheres to form an expanded microsphere. Once the microspheres have been expanded, a composite material is formed. A composite material includes (1) polymer and (2) at least one expanded microsphere. Optionally, the film can be removed from the substrate upon which it was coated before it is heated to expand the microspheres. The film can be heated using known methods. Exemplary methods include use of a convection oven, an infrared heating device or a heat gun for example. It should also be noted that part or all of the solvent can be evaporated while the film is heated to expand the microspheres. In an embodiment however, the film is heated initially to a first temperature in order to at least partially evaporate at least some of the solvent within the film; and is then heated to a second temperature to expand the gas within the microspheres. In such an embodiment, the first temperature can be less than the second temperature.

Generally, the film is heated to a temperature that affords expansion of the gas or liquid within the microsphere but does not break down the outer shell material or the polymer. The temperature to which the film is heated is dictated at least in part on the kind of polymer in the composite composition, the shell material of the microsphere, the gas or liquid within the microsphere, the extent of desired expansion of the microspheres, or a combination thereof.

In an embodiment that utilizes polymeric microspheres such as those available under then trade designation EXPANCEL, the film can generally be heated to a temperature from about 80° C. to about 190° C. Technical literature that accompanies the particular polymeric microspheres (or other type of microsphere) that are utilized can also provide further information regarding the temperature at which the microspheres will begin to expand. In an embodiment that utilizes polymeric microspheres such as those available under the trade designation EXPANCEL 461 DU 20, the film can be heated to about 150° C. When the polymeric microspheres are heated, the small amount of propellant (i.e., the gas or liquid) within the interior of the microspheres expands, while the shell material softens. The expansion of the propellant increases the pressure within the microsphere, which results in an expansion of the microspheres. The temperature at which expansion of the microspheres starts as well as the temperature at which the maximum expansion is obtained depends to some degree on the rate of heating. The time that the film is heated can dictate, at least in part, the extent of the expansion. In some embodiments that utilize polymeric microspheres, the film can be heated to about 150° C. for about 5 minutes. In other embodiments that utilize polymeric microspheres, the film can be heated to about 190° C. for about 5 to about 10 minutes. Once the film has been heated to the expansion temperature, it can, but need not be cooled to a lower temperature (e.g. room temperature) before further action is carried out on the film.

The extent to which the microspheres, for example polymeric microspheres such as those available under the trade designation EXPANCEL, are heated can be used to control at least in part the extent to which they expand. For this reason, the methods disclosed herein can offer the advantage of being able to readily control the porosity of the articles formed using such methods. This can be advantageous because it offers the ability to more effectively tailor the combination of the piezoelectric properties (for example) and the mechanical strength of the film.

After the film is heated (and optionally cooled), the film can then optionally be poled. Poling (or polarizing) the film can be accomplished as those of skill in the art know. An exemplary method of poling includes use of a corona poling process. Corona poling functions to align the charges within and around the microspheres in the film. An exemplary set up for corona poling includes a sharp needle or thin wire suspended above a larger ground plate. The distance between the wire and the ground plate can be about 1 centimeter (cm) for example. A high voltage (about 5 to about 10 kV) can be applied to the needle or wire. In an embodiment, an external field of at least about 30 MV/m can be utilized. This will cause the surrounding air to be ionized. The ionized air will then collect on an article (e.g. the film) placed between the needle and the ground plate. The charge will continue to build until equilibrium is met between the electro-forces of the plate and the environment. In an embodiment, the poling process involves heating the film, applying the poling field, and cooling the film thereby allowing the dipoles within the film to solidify while polarized. In an embodiment, thicker films (films having a thickness that is at least about 100 μm) can be heated during the poling process in order to achieve a relatively larger piezoelectric response. Such thick films can be heated to a temperature of about 70° C. to about 130° C. during the poling process. For high temperature poling the film can be heated first and the high voltage field can be applied while the film is at a high temperature. This can aid in rotating the dipole or injecting the charge. The film can then be cooled down under the field to freeze the dipole or injected charge. In an embodiment, the film can be corona charged using an electric field of approximately 20 MV/m, for about 10 minutes at a temperature of about 28° C.

In an embodiment, an electromechanical layer can have piezoelectric properties or pyroelectric properties without being mechanically stretched. The ability to avoid stretching can be advantageous from a processing standpoint and can also provide films having more desirable properties. For example, stretching can create anisotropic elastic modulus in the stretching or axial direction as compared to the transverse direction. The properties of an electromechanical layers as formed herein can be (but need not be) enhanced by being mechanically stretched.

An article formed using a method as described above can be referred to as an electromechanical film, and in an embodiment a piezoelectric film, piezoelectric layer or piezoelectric article. The electromechanical layer includes a composite material that includes (1) polymer and (2) at least one microsphere that has an outer shell made up of a shell material and a gas or liquid contained within the outer shell. The polymer at least partially encapsulates the at least one microsphere. The polymer and at least one microsphere are as discussed above.

In an embodiment, a composite material includes (1) polymer and (2) at least one expanded microsphere that has an outer shell made up of a shell material and a gas or liquid contained within the outer shell. An expanded microsphere is one that has been subjected to sufficient heating to cause the shell material of the microsphere to expand. In an embodiment, an expanded microsphere is one that has been subjected to sufficient heating to cause the shell material of the microsphere to expand at least about 1 volume %. In an embodiment, an expanded microsphere is one that has been subjected to sufficient heating to cause the shell material of the microsphere to expand at least about 5 volume %. In an embodiment, an expanded microsphere is one that has been subjected to sufficient heating to cause the shell material of the microsphere to expand at least about 25 volume %. In an embodiment, an expanded microsphere is one that has been subjected to sufficient heating to cause the shell material of the microsphere to expand at least about 100 volume %. In an embodiment, an expanded microsphere is one that has been subjected to sufficient heating to cause the shell material of the microsphere to expand at least about 500 volume %. In an embodiment, an expanded microsphere is one that has been subjected to sufficient heating to cause the shell material of the microsphere to expand at least about 1000 volume %. In an embodiment, an expanded microsphere is one that has been subjected to sufficient heating to cause the shell material of the microsphere to expand at least about 2000 volume %.

It is thought, but not relied upon that the electromechanical properties are provided to the electromechanical layer by the differences in dielectric constants of the polymer, the shell material of the microspheres and the gas or liquid within the microspheres. Generally, the polymer and the shell material have different dielectric constants and the shell material and the gas have different dielectric constants. In an embodiment, the polymer and the shell material have dielectric constants that are at least 5% different. In an embodiment, the polymer and the shell material have dielectric constants that are at least about 10% different. In an embodiment, the polymer and the shell material have dielectric constants that are at least about 20% different. In an embodiment, the shell material and the gas have dielectric constants that are at least about 5% different. In an embodiment, the shell material and the gas have dielectric constants that are at least about 10% different. In an embodiment, the shell material and the gas have dielectric constants that are at least about 20% different.

The amount of microspheres present in an electromechanical layer can be dictated, at least in part by the amount of microspheres present in a coating composition that makes the electromechanical layer. In an embodiment, the electromechanical layer can have less than or equal to about 70% microspheres based on the total weight of the electromechanical layer. For example, the electromechanical layer can contain up to 60 wt %, up to 50 wt %, or up to 40 wt % microspheres. The electromechanical layer often contains at least 10 wt %, at least 20 wt %, or at least 30 wt % microspheres. In an embodiment, the electromechanical layer can have from about 30% to about 40% microspheres based on the total weight of the electromechanical layer.

An electromechanical layer can also include additional materials, including for example processing additives (e.g. plasticizers), piezoelectric additives (barium titanate ($BaTiO_3$) and lead zirconate titanate (PZT)) or pyroelectric additives as discussed above. An electromechanical layer can also include solvent that was not entirely evaporated from the coating composition from which it was formed.

The desired thickness of an electromechanical layer can depend, at least in part, on the particular configuration that the electromechanical layer will be utilized in, the size of the microspheres in the electromechanical layer, as well as other factors. In an embodiment, an electromechanical layer can have thicknesses in the micrometer range. In an embodiment, an electromechanical layer can have a thickness from about 10 μm to about 50 μm. In an embodiment, an electromechanical layer can have a thickness from about 15 μm to about 30 μm. In an embodiment, an electromechanical layer can have a thickness from about 20 μm to about 25 μm.

An electromechanical layer can have piezoelectric properties. In an embodiment, a piezoelectric layer can have a piezoelectric coefficient ($d_{33}$) that is at least about 100 pC/N. In an embodiment, a piezoelectric layer can have a piezoelectric coefficient ($d_{33}$) that is at least about 150 pC/N. The piezoelectric coefficient can be measured using commercially available devices, including for example a PiezoTest piezometer model number PM300 (Piezotest, London, UK). An electromechanical layer can also have pyroelectric properties.

An electromechanical layer can be included in an electromechanical device. An exemplary electromechanical device is depicted in FIG. 1. An electromechanical device 100 can include an electromechanical layer 110 that is disposed between a first conductive layer 120 and a second conductive layer 130. Stated another way, the first conductive layer 120 can be disposed adjacent to, directly adjacent to, on or directly on the electromechanical layer 110; and the electromechanical layer 110 can be disposed adjacent to, directly adjacent to, on or directly on the second conductive layer 130.

The first conductive layer 120 and the second conductive layer 130 are generally made of an electrically conductive material. Exemplary electrically conductive materials can include, but are not limited to, conductive metals and conductive polymers. Exemplary conductive metals can be chosen from copper, silver, gold, platinum, aluminum or mixtures thereof. Exemplary conductive polymers can be chosen from polyacetylenes, polypyrroles, polythiophenes, polyanilines, polyfluorenes, poly(alkylthiophenes), poly(3,4-ethylendioxythiophene), polytetrathiafulvalenes), poly(p-phenylene sulfide), polyp-phenylene vinylenes) or mixtures thereof. Polymers that can be made to be conductive can also be utilized. Exemplary methods of rendering a non-conductive polymer conductive include, but are not limited to, the inclusion of conductive particles or doping. Specific exemplary materials include, but are not limited to, conductive polymers prepared from 3,4-ethylenedioxythiophene monomers such as the conductive polymer commercially available under the trade designation CLEVIOS from H.C. Starch GmbH in Gosalar, Germany. Other exemplary materials include graphite and carbon grease (MG Chemicals, Surrey, British Columbia). In an embodiment, first and second electrodes can include a sputter deposited conductive metal, such as gold for example.

Figure 2:
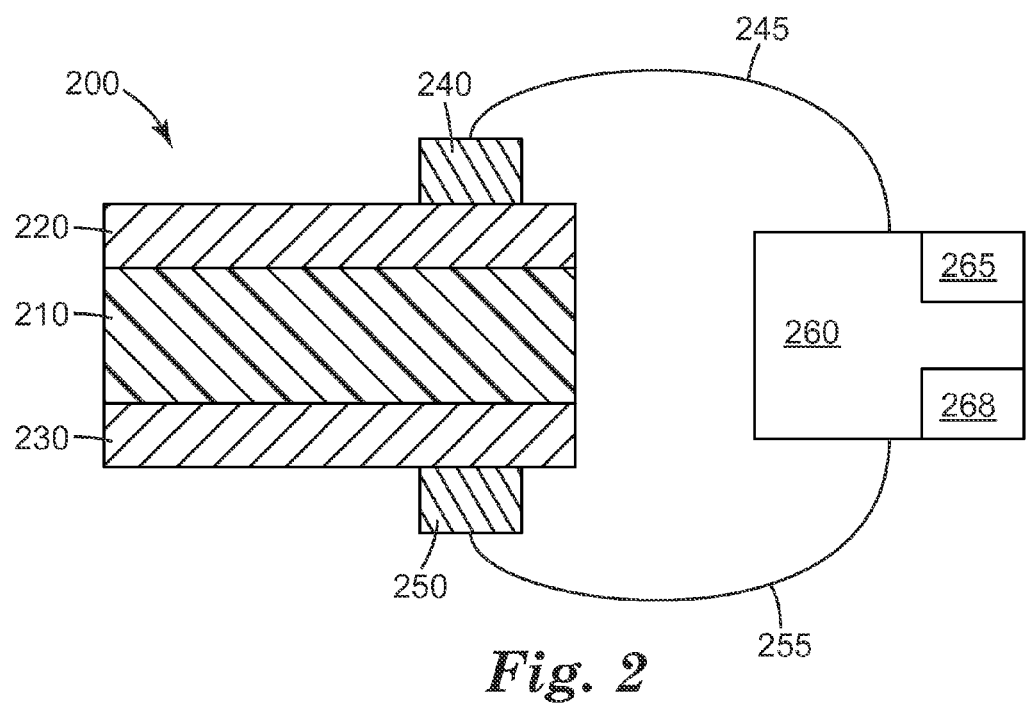
FIG. 2 depicts an exemplary electromechanical device as disclosed herein.

FIG. 2 illustrates another exemplary electromechanical device. The exemplary electromechanical device 200 depicted in FIG. 2 includes the electromechanical layer 210 positioned between the first conductive layer 220 and the second conductive layer 230. This electromechanical device 200 also includes a first electrical contact 240 that is electrically connected (and optionally physically connected) to the first conductive layer 220 and a second electrical contact 250 that is electrically connected (and optionally physically connected) to the second conductive layer 230. The first electrical contact 240 and the second electrical contact 250 can be made of any electrically conductive material, including but not limited to conductive tape for example. Suitable conductive tapes include, but are not limited to, those commercially available from 3M Company, St. Paul, Minn. under the trade designation 3M XYZ-Axis Electrically Conductive Tape 9712 or 3M XYZ-Axis Electrically Conductive Tape 9713.

The first electrical contact 240 is electrically connected (and optionally physically connected) to a first wire 245; and the second electrical contact 250 is electrically connected (and optionally physically connected) to a second wire 255. The first wire 245 and the second wire 255 are electrically connected (and optionally physically connected) to a control device 260. The first wire 245 and the first electrical contact 240 function to electrically connect the first conductive layer 220 to the control device 260; and the second wire 255 and the second electrical contact 250 function to electrically connect the second conductive layer 230 to the control device 260. Any electrically conductive wire may be utilized as the first wire 245 and the second wire 255. One of skill in the art would be aware of specific types of wire that could be utilized and would be aware of how the electrical connections should be made.

The control device 260 may function to receive an electrical signal (i.e., a voltage) from the electromechanical layer 210 when it is stressed or strained (or exposed to heat in the case of a pyroelectric layer). As such, the control device 260 may include a meter 265. Generally, the greater the stress or strain on the piezoelectric electromechanical layer 210, the greater the magnitude of the electrical signal. The meter 265 may be configured to receive and measure the electrical signal; receive and pass the electrical signal one; or receive, measure and pass the electrical signal on.

The control device 260 may also function as a source of electricity. In such an embodiment, the control device 260 can include a power supply 268. The power supply 268 is configured to apply an electrical signal to the first conductive layer 220 and the second conductive layer 230, in order to actuate (i.e. deflect, warp, bend) the electromechanical layer 210. In an embodiment, an amplifier can optionally be utilized to amplify a signal generated by the transducer.

The control device 260 can include a meter 265, a power supply 268, or both a meter 265 and a power supply 268. A control device 260 can also include more than one meter 265, more than one power supply 268, or more than one meter 265 and more than one power supply 268.

Although not depicted in the figures, an electromechanical article may also include more than one electromechanical layer. In an embodiment, multiple electromechanical layers are formed into a stack. In an embodiment, an electromechanical article may also include other polymeric layers. Other polymeric layers may be included in order to increase temperature stability of an electromechanical article, for example. Polymers that could be utilized to increase the temperature stability of an electromechanical layer include, but are not limited to, poly(phenylene sulfide) ("PPS") and Nylon for example.

EXAMPLES

Materials and Methods

Unless otherwise noted, all chemicals were obtained from Aldrich and were used without further purification.

Examples 1-33

Poly(vinylidene fluoride-trifluoroethylene)copolymer (P(VDF-TrFE)) (obtained from Solvay and Cie, Belgium) (10-20 wt %) was dissolved in methylethyl ketone (MEK) solvent at 50° C. Unexpanded polymeric microspheres, commercially available under then trade designation 461-DU-20 EXPANCEL from Expancel Incorporated, Duluth, Ga., USA) were added to the P(VDF-TrFE) solution at a concentration of about 10 pph (part per hundred). About 50 mL of this composition was then poured on a 20 μm silicon liner (CP Film Inc. Fieldale, Va.) and dried in the oven at 60° C. to evaporate the solvent. The dried and unexpanded composite film was then removed from the liner.

The piezoelectric property ($d_{33}$) of the unexpanded composite film was then measured using a PiezoTest precision piezometer system m (Piezotest, London, United Kingdom). The $d_{33}$ value for the composite film was 0.1 pC/N before the polymeric microspheres were expanded.

The film was then heated to 150° C. for about 5 minutes in order to expand the polymeric microspheres. After heating, the film was cooled down to room temperature. The film was then corona charged by passing the film, while in contact with an aluminum ground plane, through a direct current (i.e., DC) corona charger equipped with a series of stainless steel wires at a voltage of greater than 20 MV/m. The wires were positioned at a distance of 1 inch (2.5 cm) from the ground plane, and were spaced such that the corona discharge was continuous. The piezoelectric property ($d_{33}$) was then measured using a PiezoTest piezometer, model number PM300 (Piezotest, London, United Kingdom).

Examples 2 through 33 were prepared in the same fashion as Example 1, by dissolving 10-20 wt % of poly(vinylidene fluoride-trifluoroethylene)copolymer (referred to as P(VDF-TrFE)) in methylethyl ketone (MEK) solvent at 50° C. Unexpanded microspheres according to Table 1 were added to the solution at the concentrations given in Table 1. All the microspheres were polymeric microspheres commercially available under the trade designation EXPANCEL. Various amounts of the composition was then poured onto 20 μm silicon liner (CP Film Inc. Fieldale, Va.) and dried in the oven at 60° C. to evaporate the solvent, giving the dried thicknesses shown in Table 1. The dried P(VDF-TrFE)-polymeric microsphere composite films were then removed from the liners. The films were then heated to temperatures shown in Table 1 for times shown in Table 1 to expand the polymeric microspheres. After heating, the films were cooled down to room temperature. The films then was polarized and tested as explained above.

TABLE 1

| Example Number | Type of polymeric microspheres | Expansion Conditions (° C. and time) | Wt % of Microspheres | Dry Thickness (μm) | $d_{33}$ (pC/N) |
|---|---|---|---|---|---|
| 1 | 461-DU-20 | 150° C. 5 min | 10 | 20 | 139 ± 14 |
| 2 | 461-DU-20 | 150° C. 5 min | 10 | 23 | 178 ± 20 |
| 3 | 095-DU-120 | 150° C. 5 min | 1 | 23 | 62 ± 15 |
| 4 | 095-DU-120 | 150° C. 5 min | 1 | 17 | 158 ± 40 |
| 5 | 461-DU-20 | 150° C. 5 min | 3 | 31 | 58 ± 4 |
| 6 | 461-DU-20 | 150° C. 5 min | 1 | 21 | 71 ± 17 |
| 7 | 095-DU-120 | 170° C. 5 min | 1 | 9 | 189 ± 16 |
| 8 | 095-DU-120 | 170° C. 5 min | 1 | 10 | 192 ± 13 |
| 9 | 095-DU-120 | 170° C. 5 min | 3 | 15 | 115 ± 20 |
| 10 | 461-DU-20 | 170° C. 5 min | 1 | 11 | 121 ± 9 |
| 11 | 461-DU-20 | 170° C. 5 min | 3 | 10 | 184 ± 16 |
| 12 | 461-DU-20 | 170° C. 5 min | 5 | 17 | 165 ± 24 |
| 13 | 461-DU-20 | 170° C. 5 min | 7 | 14 | 70 ± 13 |
| 14 | 095-DU-120 | 180° C. 5 min | 1 | 10 | 126 ± 29 |
| 15 | 095-DU-120 | 180° C. 5 min | 1 | 10 | 127 ± 3 |
| 16 | 095-DU-120 | 180° C. 5 min | 3 | 15 | 84 ± 37 |
| 17 | 461-DU-20 | 180° C. 5 min | 1 | 12 | 103 ± 64 |
| 18 | 461-DU-20 | 180° C. 5 min | 3 | 12 | 96 ± 36 |
| 19 | 095-DU-120 | 190° C.- 5 min | 1 | 7 | 135 ± 2 |
| 20 | 095-DU-120 | 190° C.- 5 min | 1 | 8 | 284 ± 17 |
| 21 | 095-DU-120 | 190° C.- 5 min | 3 | 11 | 172 ± 15 |
| 22 | 095-DU-120 | 190° C.- 5 min | 3 | 16 | 166 ± 32 |
| 23 | 461-DU-20 | 190° C.- 5 min | 1 | 16 | 157 ± 32 |
| 24 | 461-DU-20 | 190° C.- 5 min | 1 | 14 | 158 ± 46 |
| 25 | 461-DU-20 | 190° C.- 5 min | 3 | 13 | 197 ± 43 |
| 26 | 461-DU-20 | 190° C. 5 min | 3 | 14 | 127 ± 9 |
| 27 | 461-DU-20 | 190° C. 5 min | 5 | 20 | 156 ± 6 |
| 28 | 461-DU-20 | 190° C. 5 min | 5 | 18 | 197 ± 18 |
| 29 | 461-DU-20 | 190° C. 5 min | 5 | 8 | 105 ± 16 |
| 30 | 095-DU-120 | 190° C. 7 min | 1 | 11 | 100 ± 6 |
| 31 | 461-DU-20 | 190° C. 7 min | 1 | 11 | 335 ± 41 |
| 32 | 461-DU-20 | 190° C. 7 min | 3 | 9 | 584 ± 122 |
| 33 | 461-DU-20 | 190° C. 7 min | 5 | 12 | 188 ± 21 |

Example 34

A PVDF-TrFE polymer was dissolved in MEK at room temperature as described in Example 1 above. Unexpanded polymeric microspheres (461-DU-20 EXPANCEL microspheres) were added to the P(VDF-TrFE) solution at a concentration of about 5 pph. This composition was then coated onto a glass plate which was then placed in the oven at 60° C. to evaporate solvent. The dried and unexpanded composite film was then removed from the glass plate. The film was then heated up to 170° C. for about 5 minutes to expand the polymeric microspheres.

The film was then polarized using a corona charging process by applying a positive electric field >20 MV/m. The piezoelectric property $d_{33}$ was measured using the PiezoTest piezometer. The initial piezoelectric coefficient ($d_{33}$) of 165±23.6 was measured. The sample was allowed to age at room temperature and the piezoelectric coefficient was measured at various amounts of days from formation of the film. Table 2 shows the measured piezoelectric coefficient measured at 51, 94 and 191 days from formation.

TABLE 2

| Aging Days | $d_{33}$ (pC/N) |
|---|---|
| 0 | 165 ± 23 |
| 51 | 155 ± 35 |
| 94 | 129 ± 28 |
| 191 | 123 ± 30 |

Example 35

Another sample was prepared using the same method as Example 1. The final thickness of the composite film was about 20 microns. This sample, once polarized was kept in the oven at a relatively high temperature (about 65° C.) for an aging study. Table 3 shows the measured piezoelectric coefficient measured at 0, 1, 3, 7, 105, 138 and 202 days after formation.

TABLE 3

| Aging Days | $d_{33}$ (pC/N) |
|---|---|
| 0 | 139 ± 14 |
| 1 | 98 ± 17 |
| 3 | 95 ± 13 |
| 7 | 84 ± 16 |
| 105 | 89 ± 10 |
| 138 | 97 ± 9 |
| 202 | 90 ± 10 |

Thus, embodiments of electromechanical materials and devices including the same are disclosed. One skilled in the art will appreciate that the present disclosure can be practiced with embodiments other than those disclosed. The disclosed embodiments are presented for purposes of illustration and not limitation, and the present disclosure is limited only by the claims that follow.

We claim:

1. An electromechanical article comprising an electromechanical layer comprising an electromechanical material that is a composite material comprising:
   a polymer; and
   at least one microsphere having an outer shell comprising a shell material and a gas or liquid contained within the outer shell of the microsphere, wherein the composite material comprises up to 50 weight percent microspheres,
   wherein the polymer at least partially encapsulates the microsphere and the polymer, shell material of the microsphere and gas or liquid within the microsphere all have different dielectric constants wherein the electromechanical article has piezoelectric properties or pyroelectric properties.

2. The electromechanical article according to claim 1, wherein the polymer is a vinyl polymer.

3. The electromechanical article according to claim 1, wherein the polymer comprises poly(vinylidene fluoride).

4. The electromechanical article according to claim 1, wherein the at least one microsphere is an expanded polymeric microsphere having an unexpanded diameter from about 5 micrometers (μm) to about 50 micrometers (μm).

5. The electromechanical article according to claim 1, wherein the at least one microsphere comprises glass.

6. The electromechanical article according to claim 1, wherein the at least one microsphere comprises a ceramic material.

7. The electromechanical article according to claim 1, wherein the shell material comprises a polymer.

8. The electromechanical article according to claim 1, wherein the composite material comprises less than or equal to about 70 wt % microspheres based on the total weight of the composite material.

9. The electromechanical article according to claim 8, wherein the composite material comprises from about 30 wt % to about 40 wt % microspheres based on the total weight of the composite material.

10. The electromechanical article according to claim 1, wherein the composite material further comprises a plasticizer.

11. The electromechanical article according to claim 1, wherein the composite material has piezoelectric properties.

12. The electromechanical article according to claim 11, wherein the composite material further comprises barium titanate ($BaTiO_3$), lead zirconate titanate (PZT), or combinations thereof.

13. A electromechanical device comprising:
a electromechanical layer, the electromechanical layer comprising an electromechanical material that is a composite material comprising:
a polymer; and
at least one microsphere having an outer shell comprising a shell material and a gas or liquid contained within the outer shell, wherein the composite material comprises up to 50 weight percent microspheres,
wherein the polymer at least partially encapsulates the microsphere and the polymer, the shell material of the microsphere and the gas or liquid within the microsphere all have different dielectric constants;
a first conductive layer; and
a second conductive layer,
wherein the electromechanical layer is positioned between and in electrical connection with both the first conductive layer and the second conductive layer.

14. The electromechanical device according to claim 13 further comprising
a first electrical contact that is electrically connected to the first conductive layer;
a second electrical contact that is electrically connected to the second conductive layer;
a control device electrically connected to the first electrical contact and the second electrical contact.

15. The electromechanical device according to claim 14, wherein the control device comprises a meter, a power supply, or both.

* * * * *